United States Patent

Malek-Khosravi et al.

[11] Patent Number: 5,161,161
[45] Date of Patent: Nov. 3, 1992

[54] MINIMUM PULSEWIDTH TEST MODULE ON CLOCKED LOGIC INTEGRATED CIRCUIT

[75] Inventors: Behnam Malek-Khosravi, San Diego; Matthew L. McCullough, Carlsbad; Steven M. Domer, Vista, all of Calif.

[73] Assignee: Unisys Corporation, Blue Bell, Pa.

[21] Appl. No.: 709,075

[22] Filed: May 30, 1991

Related U.S. Application Data

[63] Continuation of Ser. No. 304,550, Jan. 31, 1989, abandoned.

[51] Int. Cl.⁵ .................. G06F 11/24; H03K 5/156
[52] U.S. Cl. ........................... 371/28; 307/269
[58] Field of Search ............... 371/27, 28; 307/269

[56] References Cited

U.S. PATENT DOCUMENTS 4,290,022 9/1981 Puckette ..................... 328/55
4,546,269 10/1985 Johnson ..................... 307/269

OTHER PUBLICATIONS

IBM Technical Disclosure Bulletin, "Programmable LSSD Clock Generator", vol. 31, No. 2, Jul. 1988, pp. 81-2.

Primary Examiner—Stephen M. Baker
Attorney, Agent, or Firm—Charles J. Fassbender; Mark T. Starr

[57] ABSTRACT

An integrated circuit chip which contains conventional clocked logic circuitry also contains a tester module for determining the minimum pulsewidth at which the clocked logic circuitry will operate. This tester module occupies a very small portion of the chip, yet it is able to generate several different variable width clock pulse sequences in which the pulsewidths range from being large enough for the clocked logic circuitry to properly operate to being too small for proper operation. By passing these sequences through the clocked logic circuitry, the minimum pulsewidth at which that circuitry will operate can be easily determined.

14 Claims, 5 Drawing Sheets

Fig. 7 eq. 1   4 FF'S of FIG. 3, $\frac{1}{2}$ cell per FF = 2 cells eq. 2   2 gates of FIG. 3, $\frac{1}{4}$ cell per gate = $\frac{1}{2}$ cell eq. 4   2(N+1)+2 gates of FIG. 4, N is 15 = $8\frac{1}{2}$ cells eq. 5   4 FF'S of FIG. 5 CNTR (MAX CNT is 15) = 2 cells eq. 6   5 gates of FIG. 5 = $1\frac{1}{4}$ cells eq. 7   1 of 16 decoder, $\frac{1}{2}$ cell per 1 of 4 decoder = 2 cells eq. 8   2 FF'S of FIG. 6 = 1 cell eq. 9   4 gates of FIG. 6 = 1 cell eq. 10  total = $18\frac{1}{4}$ cells eq. 11  % chip spare = $\dfrac{18\frac{1}{4}}{414}$ = 4.40 %

MINIMUM PULSEWIDTH TEST MODULE ON CLOCKED LOGIC INTEGRATED CIRCUIT

This is a continuation of copending application Ser. No. 304,550 filed on Jan. 31, 1989 now abandoned.

BACKGROUND OF THE INVENTION

This invention relates to integrated circuit chips; and more particularly, it relates to the testing of clocked logic circuitry on such chips.

By clocked logic circuitry is herein meant any type of logic circuit that receives a clock signal, which is a series of pulses, and which responds to either high-to-low transitions or low-to-high transitions in the pulses. Some examples of clocked logic circuitry are D-type flip-flops, JK-type flip-flops, counters, and shift registers. Hundreds of these kinds of circuits commonly exist in various combinations and interconnections on a single chip.

One characteristic of a clocked logic circuit is that the pulses in the clock signal must have a certain minimum width in order for the clocked logic circuit to operate properly. However, making the width of the clock pulses larger inherently lowers the clock frequency and thus lowers the speed at which the clocked logic circuitry operates. Often, the clocked logic circuitry is performing some function in which the speed of execution is critical and must be minimized. Thus, a need exists for determining just how small the width of the pulses in the clock signal can be made without causing the clocked logic circuitry to operate improperly.

Currently, as well as in the past, various commercially available instruments called "pulse generators" were used to generate narrow width clock pulses as test signals for the clocked logic chips. However, one of the problems with such instruments is that at any one time, they merely generate pulses of a simple width, and manual interaction with the instrument is required to change that pulsewidth. Commercially available pulse generators do not generate variable width pulse sequences in which each successive pulse is automatically increased or decreased, and as is shown later herein, such variable width pulse sequences are very useful in testing clocked logic chips.

Another problem with commercially available pulse generators is that today's clocked logic chips are too fast to be fully tested by the instrument. That is, the clocked logic circuitry on the chip will operate properly even when it is given the narrowest clock pulses which the instrument can deliver. For example, the latest state-of-the-art pulse generator from Hewlett Packard is the HP model 8131A; and the narrowest pulses which it can generate are 500 picoseconds wide. This is documented in the 1989 Hewlett Packard TEST AND MEASUREMENT catalog at page 433. That page also lists the narrowest pulses from earlier pulse generator models at 2 nanoseconds, 4 nanoseconds, and larger. But, by comparison, the MCA3 clocked logic cells from Motorola operate properly with clock pulses that are less than 300 picoseconds wide.

Still another problem with commercially available pulse-generating instruments is that they are very expensive. For example, the above-referred HP 8131A instrument, without any optional features or accessories, costs $14,300. This is documented on page 437 of the above-referenced TEST AND MEASUREMENT catalog.

Accordingly, a primary object of this invention is to overcome both the performance and the expense problems which are pointed out above.

BRIEF SUMMARY OF THE INVENTION

In accordance with the present invention, an integrated circuit chip of the type that contains clocked logic circuitry includes a tester module for determining the minimum pulsewidth at which said clocked logic circuitry will operate. This tester module, in one preferred embodiment, occupies less than 5% of the integrated circuit chip, and it comprises: (a) a timing circuit for generating constant width timing pulses; (b) a counting circuit, coupled to the timing circuit, for producing count signals which count modulo N in synchronization with the timing pulses, where N is a predetermined positive integer; and, (c) a pulse shaping circuit, coupled to receive the timing pulses and the count signals, for generating sequences of variable width clock pulses in response thereto. Each variable width clock pulse has a different width that is selected by the modulo N count signals, and the pulsewidths of each sequence range from being large enough for the clocked logic circuitry to properly operate to being too small for proper operation.

BRIEF DESCRIPTION OF THE DRAWINGS

Various features and advantages of the invention are described herein in conjunction with the accompanying drawings wherein:

FIG. 7 is a set of equations which show that the FIG. 1 test module occupies less than 5% of the surface area of the chip on which it is incorporated.

DETAILED DESCRIPTION OF THE INVENTION

Figure 1:
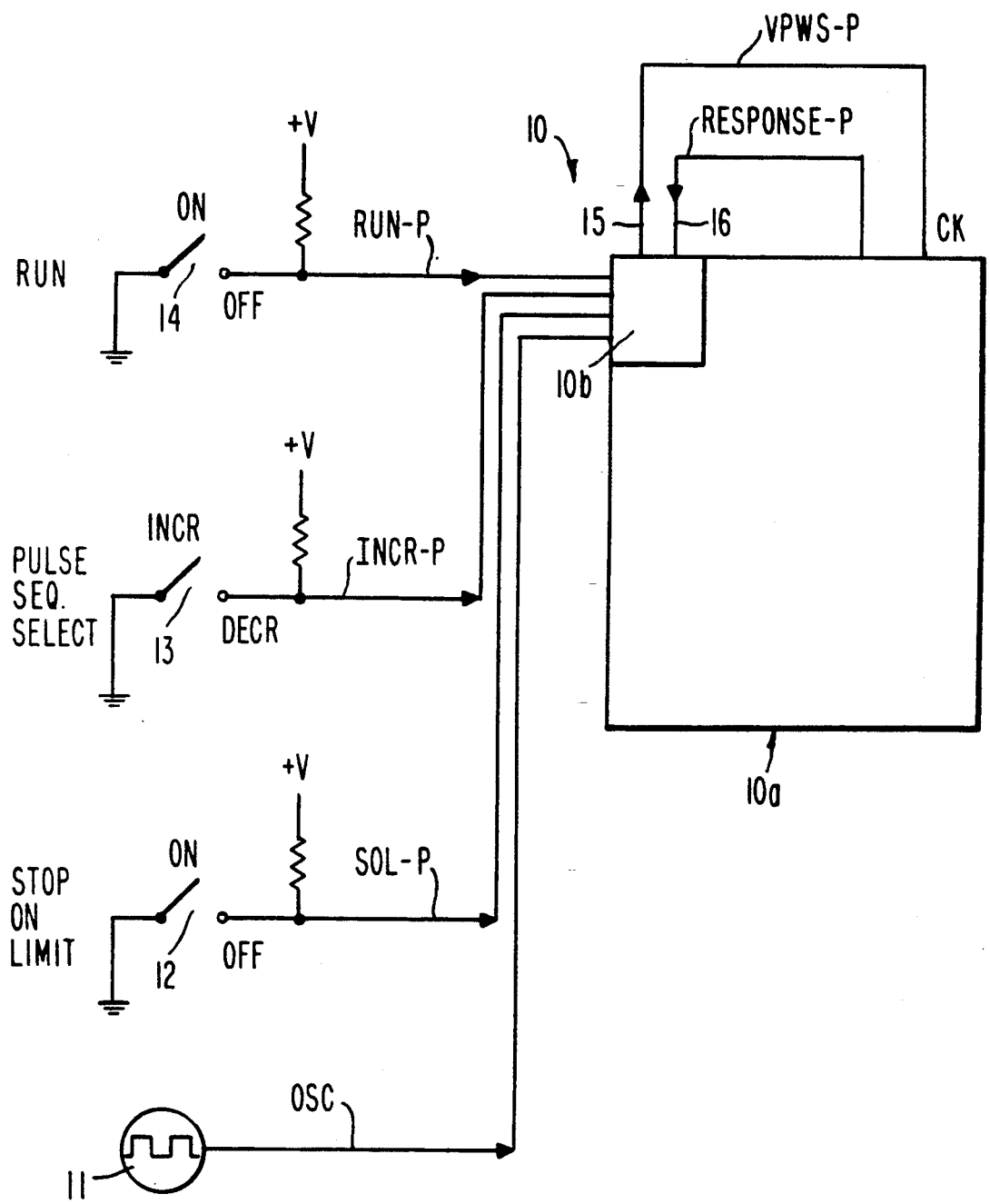
FIG. 1 illustrates an integrated circuit chip which contains a test module in accordance with the invention, along with certain external manual controls for the test module.

Referring now to FIG. 1, it shows an integrated circuit chip 10 that is constructed according to the invention. Chip 10 contains clocked logic circuitry 10a which occupies over 95% of the chip's surface, and a tester module 10b which occupies less than 5% of the chip's surface. This clocked logic circuitry is of the type described in the Background of the Invention, and it may be configured in any fashion.

Module 10b operates in conjunction with an oscillator 11 and three switches 12, 13, and 14, all of which are external to the chip 10. Switch 14 is a RUN switch which, when it is in the ON position, causes the module 10b to generate variable width pulse sequences on an output terminal 15, and switches 12 and 13 control the sequence in which the width of the pulses vary on the output terminal. All of the various pulse sequences which can be obtained via the switches 12, 13, and 14 are explained below in conjunction with FIG. 2. Module 10b also has an input terminal 16 for receiving a response signal from the clocked logic circuitry 10a so that the sequence of the pulses on output terminal 15 can be altered as a function of that response signal.

Figure 2:
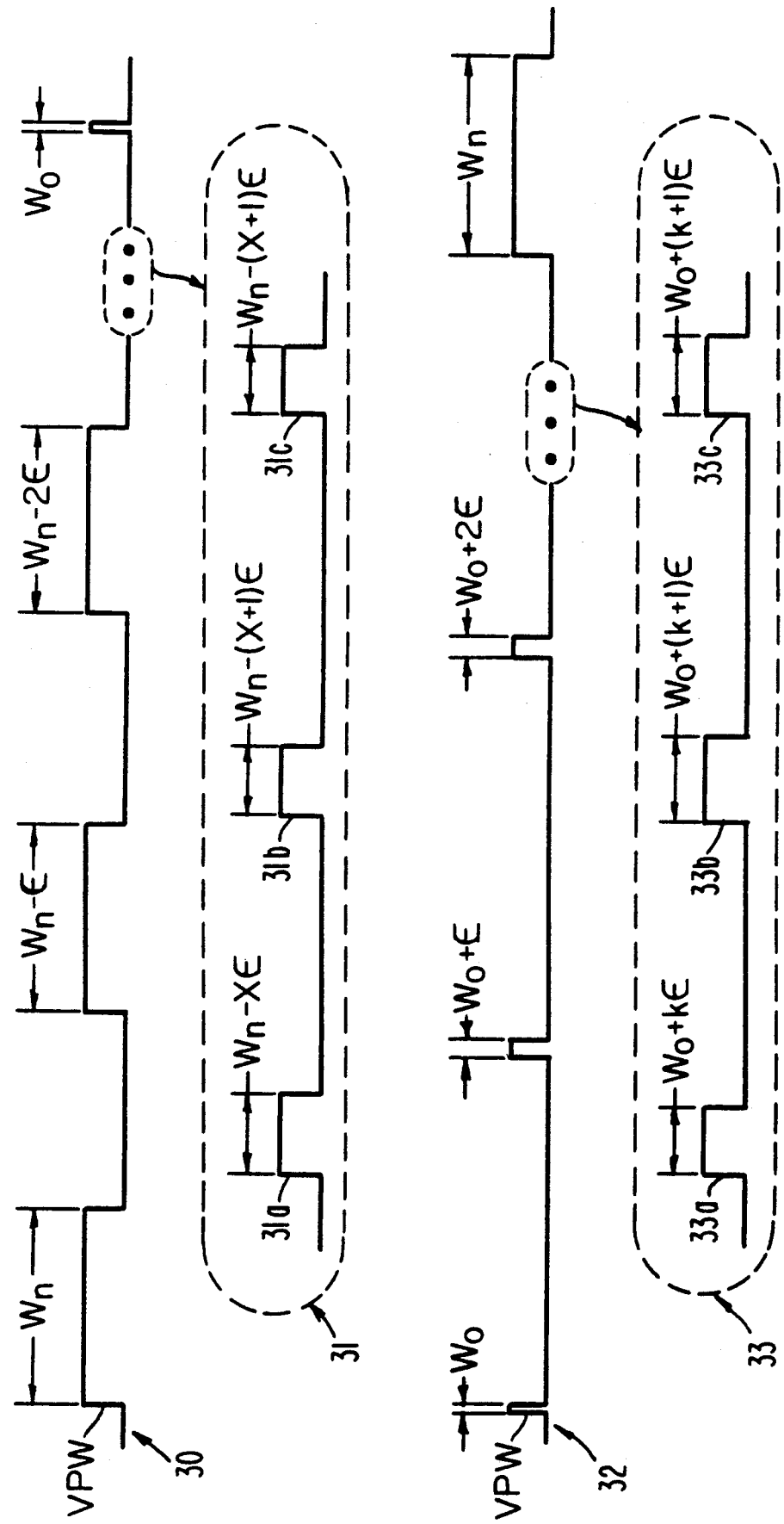
FIG. 2 illustrates the various pulse sequences that are generated by the FIG. 1 test module.

Next, considering FIG. 2, it illustrates the different pulse sequences 30, 31, 32, and 33 which module 10b generates on its output terminal 15. Beginning first with sequence 30, it occurs when the RUN switch 14 is in the ON position and the PULSE SEQUENCE SELECT switch 13 is in the DECREASE position and the STOP ON LIMIT switch 12 is in the OFF position. In sequence 30, the width of the pulses on output terminal 15 starts from a maximum width $w_n$ and sequentially decreases from one pulse to the next until a minimum pulsewidth $w°$ is reached. Then, the entire sequence repeats over and over.

To determine the smallest pulsewidth at which the clocked logic circuitry 10a will operate, the pulse sequence 30 is sent to the clock input terminal CK of that circuitry 10a; and sequence 30 along with the response signal from the clocked logic circuitry 10a are simply viewed simultaneously on a scope. All of the circuitry 10a will respond correctly to the large width pulses in sequence 30, but an error will occur in the response signal after the width of the pulses in sequence 30 gets too small. And, the first error in the response as well as the width of the pulse which caused it can be seen on the scope.

Sequence 31 occurs when the RUN switch 14 is in the ON position and the PULSE SEQUENCE SELECT switch 13 is in the DECREASE position and the STOP ON LIMIT switch 12 is in the ON position. In sequence 31, the width of the pulses from the output terminal 15 sequentially decreases until the response signal on input terminal 16 stops changing state. When that occurs, the width of the pulses on output terminal 15 are kept at the width which first failed to produce a change of state in the response signal. In sequence 31, for example, the pulses 31b and 31c plus all subsequent pulses have the same width. This sequence is useful when the response signal is supposed to change state for each pulse that is sent to the clock input terminal CK, such as when the response signal comes from the least significant bit of a counter.

Sequence 32 is generated by the FIG. 1 tester when the RUN switch 14 is in the ON position and the PULSE SEQUENCE SELECT switch 13 is in the INCREASE position, and the STOP ON LIMIT switch 12 is in the OFF position. In sequence 32, the initial pulse has the minimum width $w_o$ and successive pulses sequentially increase in width until the maximum pulsewidth $w_n$ is reached. Then, the entire sequence is repeated. Using pulse sequence 32, the clocked logic circuitry 10a will initially respond with errors, but the errors will stop as the width of the pulses increases. And, the first pulse to not cause an error can be determined by viewing the pulse sequence on terminal 15 and the response signal on terminal 16 simultaneously with a scope.

Sequence 33 is generated when the RUN switch 14 is in the ON position and the PULSE SEQUENCE SELECT switch 13 is in the INCREASE position and the STOP ON LIMIT switch 12 is in the ON position. This sequence 33 is similar to sequence 32 except that the width of the pulses on the output terminal 15 stops increasing as soon as the first transition occurs in the response signal on input terminal 16. This is shown by the pulses 33b and 33c in sequence 33. Here again, this sequence is useful when the response signal is supposed to change state for each pulse on the clock input terminal CK.

Turning now to FIG's 3, 4, 5 and 6, they show all of the circuit details of the tester module 10b which generate the above described pulse sequences. In general, the FIG. 3 circuit is a timing circuit; the FIG. 4 circuit is a pulse-shaping circuit; the FIG. 5 circuit is a counting circuit; and the FIG. 6 circuit is a control circuit. All of these circuits operate in conjunction with one another, and their interconnections are indicated by the signal names that go from one figure to another.

Figure 3:
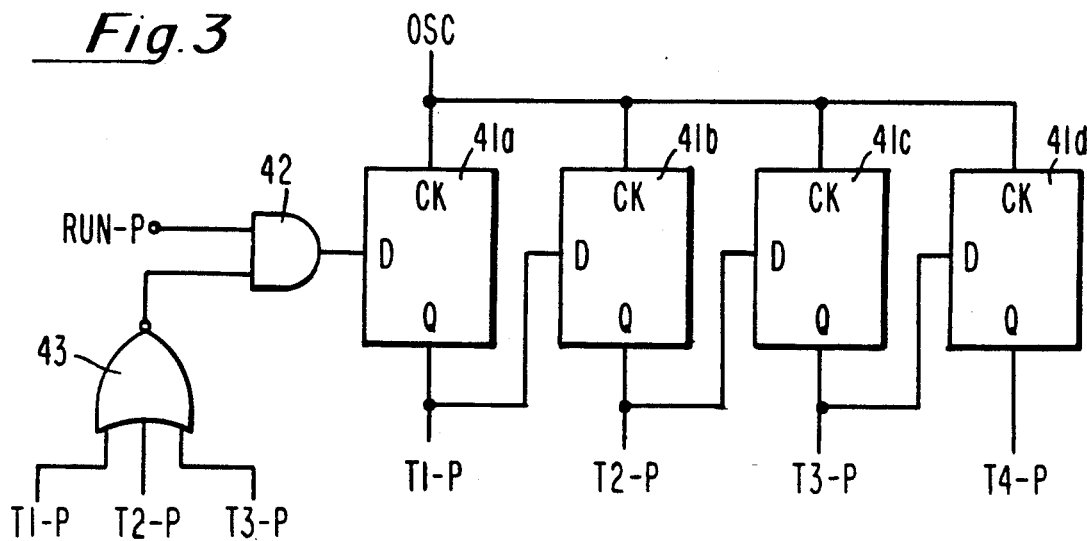
FIG. 3 is a detailed logic diagram of a timing circuit that is included within the FIG. 1 test module.

Considering first the FIG. 3 timing circuit, it consists of four D-type flip-flops 41A through 41D, an AND gate 42, and a NOR gate 43. All of these components are interconnected as illustrated. In operation, the flip-flops 41A through 41D form a shift register which is continuously clocked by the oscillator output OSC. When the RUN switch 14 is in the OFF position, all the flip-flops 41A–41D get reset since the output of gate 42 will be low. Then, when the RUN switch 14 is moved to the ON position, the output of gate 42 will go high and flip-flop 41A will set on the next low to high transition of signal OSC. On the following low to high transitions of signal OSC, flip-flop 41B will set while flip-flop 41A resets; then, flip-flop 41C will set while flip-flop 41B resets; and then, flip-flop 41D will set while flip-flop 41C resets. This entire sequence will continuously repeat until the RUN switch 14 is again returned to the OFF position. In this manner, flip-flops 41A through 41D respectively generate constant width timing signals T1-P through T4-P; and those timing signals are used by the remaining circuits of FIG's 4, 5, and 6.

Figure 4:
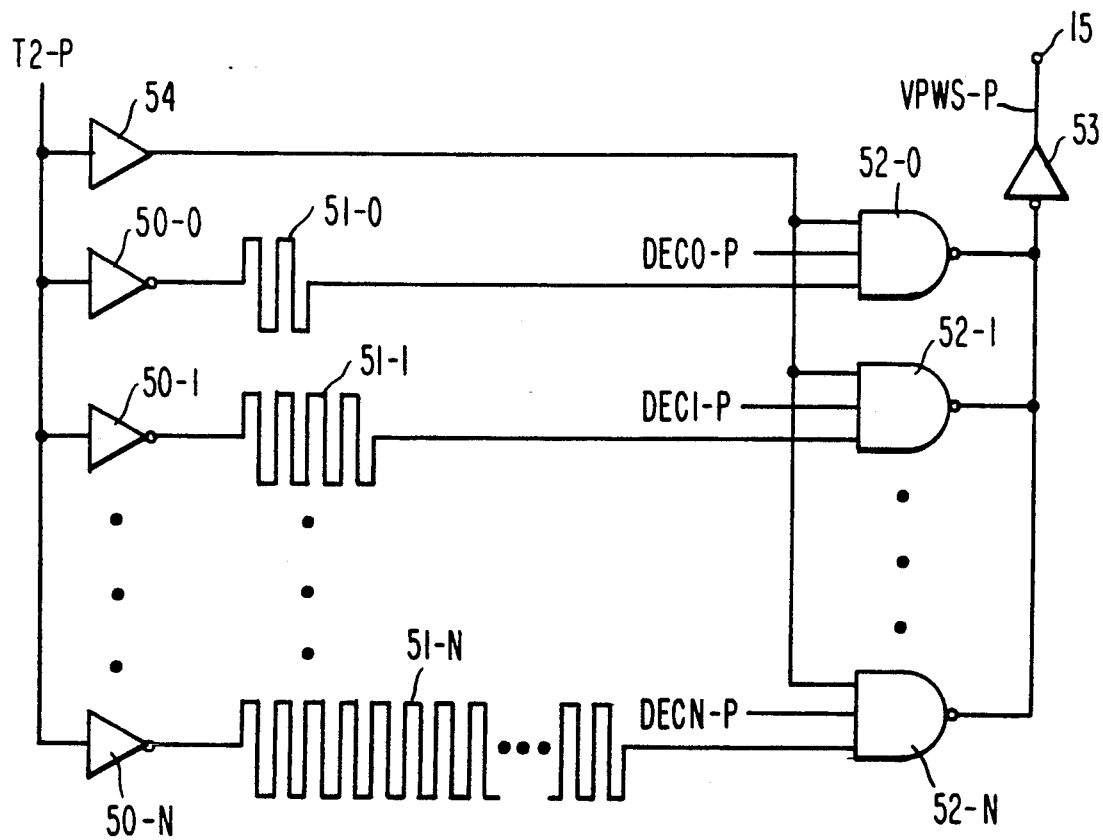
FIG. 4 is a detailed logic diagram of a pulse shaping circuit that is included within the FIG. 1 test module.

Next, referring to the FIG. 4 pulse-shaping circuit, it consists of a plurality of two input INVERTER gates 50-0 through 50-N, a plurality of delay components 51-0 through 51-N, a plurality of three input NAND gates 52-0 through 52-N, an inverter 53, and a non-inverting gate 54. Here, N is any predetermined positive integer which suitably is in the range of eight to thirty-two. All of these components are interconnected as illustrated.

One of the input signals to the FIG. 4 circuit is the timing signal T2-P from the FIG. 3 timing circuit. Signal T2-P passes through the non-inverting gate 54, and then it goes in parallel to all the NAND gates 52-0 through 52-N. Each of the INVERTERS 50-0 through 50-N also receives the timing signal T2-P, and the output signal of each inverter gets delayed by a different amount of time by the delay components 51-1 through 51-N. Those delayed signals are then ANDed by the logic gates 52-0 through 52-N. This AND operation generates the variable width pulses on output terminal 15 by chopping the constant width pulse T2-P from gate 54 to a width that is equal to the delay through one of the components 51-0 through 51-N, and that delay is selected by the count signals. In FIG. 4, the count signals are DEC0-P through DECN-P. Signal DEC0-P is high when the FIG. 5 counting circuit has reached a count of zero; signal DEC1-P is high when the FIG. 5 counting circuit has reached a count of 1; etc.

Preferably, each of the delay components 51-0 through 51-N is an ON-chip interconnection of a certain measured length. By this means, the timing pulse T2-P can be chopped into the very narrow pulses which are needed in order to cause the clocked logic circuitry to fail. For example, the signal delay through a 1.5 micron wide metal line is about 1.25 picoseconds per mil of line length. Thus, line 51-0 will have a 50 picosecond delay by making it 40 mils long; line 51.1 will have a 100 picosecond delay by making it 80 mils long, etc. Using such delays, and setting N equal to sixteen, the pulses in sequence 32 will be 50ps, 100ps, 150ps, ... 800ps.

Figure 5:
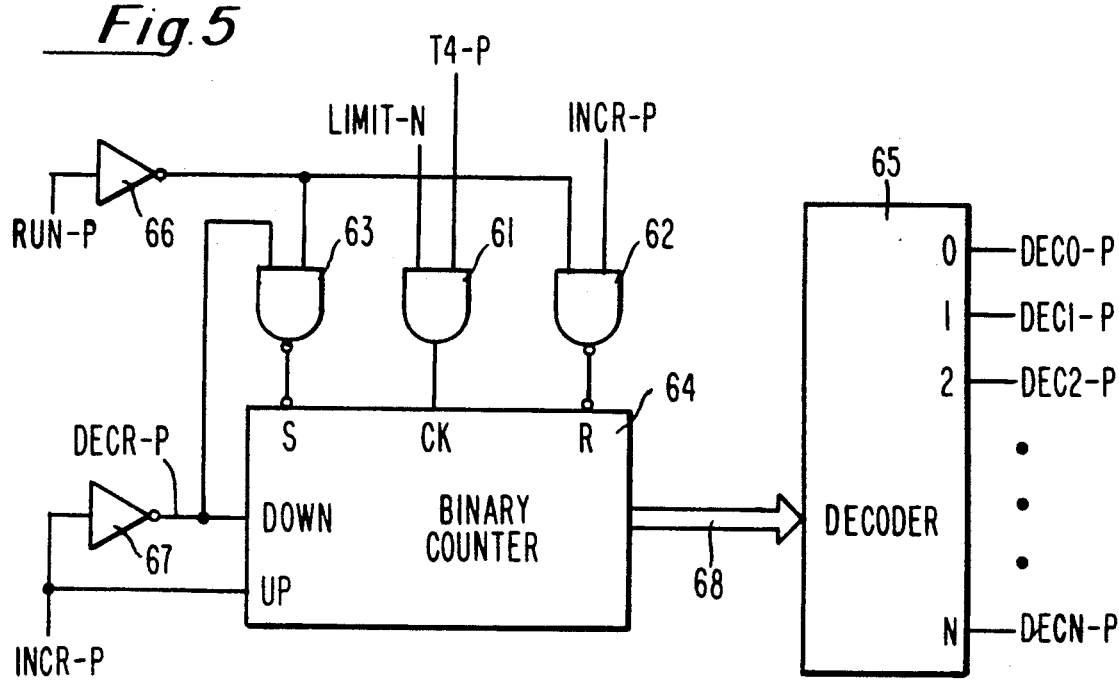
FIG. 5 is a detailed logic diagram of a counting circuit that is included within the FIG. 1 test module.

Considering next the FIG. 5 counting circuit, it includes an AND gate 61, a pair of NAND gates 62 and 63, a binary counter 64, a decoder 65, and a pair of inverters 66 and 67, all of which are interconnected as shown. NAND gate 62 resets the binary counter 64 to a count of all zeroes when the RUN switch 14 is in the OFF position and the PULSE SEQUENCE SELECT switch 13 is in the INCREMENT position. By comparison, NAND gate 63 sets the binary counter 64 to a count of all ones when the RUN switch 14 is in the OFF position and the PULSE SEQUENCE SELECT switch 13 is in the DECREMENT position.

When the RUN switch 14 is placed in the ON position, the timing pulses T4 will pass through AND gate 61 and clock the binary counter 64 which, in response, will increment or decrement its count based on the position of the PULSE SEQUENCE SELECT switch 13. That counting continues in a modulo N fashion until either the RUN switch 14 is returned to the OFF position of a LIMIT signal is forced low by the FIG. 6 circuit to inhibit the passing of the timing pulse T4 through AND gate 61. Output signals from the binary counter 64 which represent the count in the counter are sent via a bus 68 to the decoder 65. That decoder 65 forces signal DEC0-P high when the binary count on bus 68 is zero, forces signal DEC1-P high when the binary count on bus 68 is one, etc.

Figure 6:
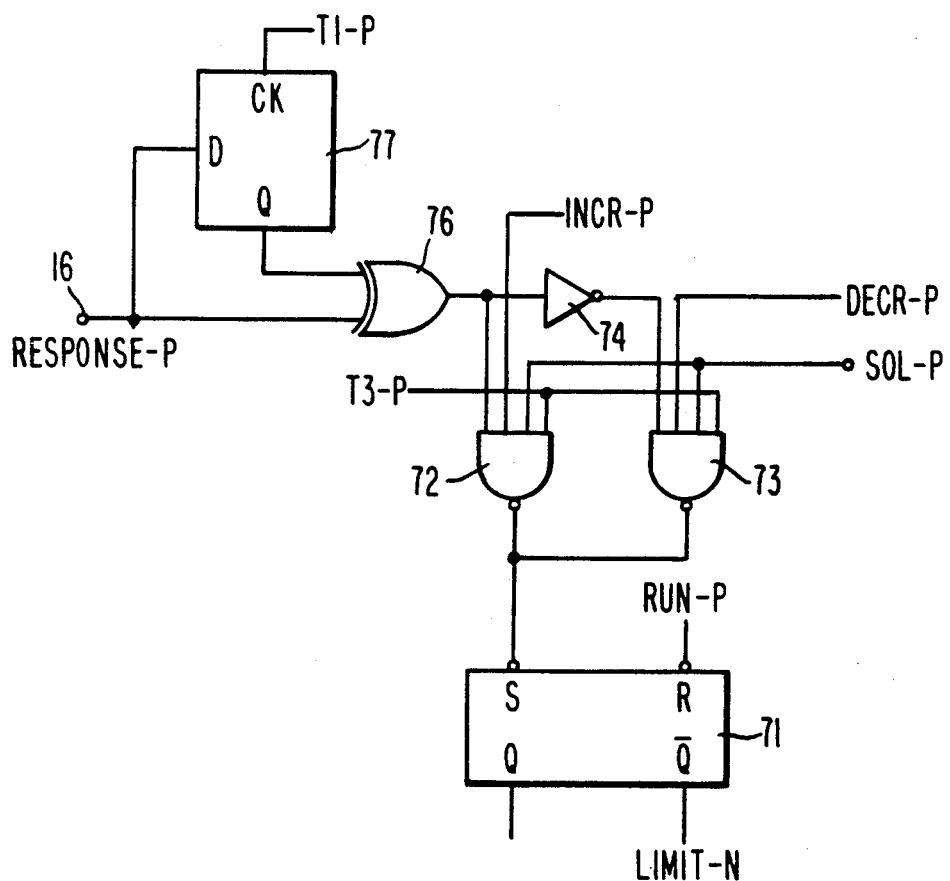
FIG. 6. is a detailed logic diagram of a control circuit that is included within the FIG. 1 test module.

Next, turning to the FIG. 6 control circuit, it consists of a set-reset flip-flop 71, a pair of NAND gates 72 and 73, a pair of inverters 74 and 75, an EXCLUSIVE OR gate 76, and a D flip-flop 77. These components are interconnected as shown. In operation, the FIG. 6 circuit generates the LIMIT signal which is sent to the FIG. 5 counting circuit to inhibit the count from changing. Initially, when the RUN switch 14 is placed in the OFF position, the RUN-P signal will be forced low (false) and so flip-flop 71 will be reset. Then, after the RUN switch 14 is placed in the ON position, flip-flop 71 will stay reset until all of the input signals to either NAND gate 72 or NAND gate 73 are all high. NAND gate 72 will cause the flip-flop 71 to set if: (a) the STOP ON LIMIT switch 12 is in the ON position, and (b) the timing pulse T3 occurs, and (c) the PULSE SEQUENCE SELECT switch 13 is in the DECREMENT position, and (d) the response signal on input terminal 16 is the same as the response signal that was received before the last pulse was sent on output terminal 15. By comparison, NAND gate 73 will set the flip-flop 71 if: (a) the STOP ON LIMIT switch 12 is in the ON position, and (b) the timing pulse T3 occurs, and (c) the PULSE SEQUENCE SELECT switch 13 is in the INCREMENT position, and (d) the response signal on input terminal 16 differs from the response signal which was received before the last pulse on the output terminal 15 was sent. Flip-flop 77 operates to save the response which occurred on input terminal 16 before the last output pulse was sent, and the EXCLUSIVE OR gate 76 operates to compare that saved response with the current response.

Referring now to FIG. 7, it contains a set of equations which show that the above described test module will require less than 5% of the area that is available for components on the integrated circuit chip 10. Most logic chips do not use 100% of the chip space that is available; and thus it is feasible to add the test module 10b to practically any clocked logic circuit chip.

In the analysis of equations 1–11, certain logic cells are used which are commercially available in the MCA3 cell library from Motorola. Equations 1 and 2 of FIG. 7 show the chip space that is needed to implement the FIG. 3 circuitry. Equation 1 says that in FIG. 3, there are four flip-flops, and each flip-flop can be implemented in one-half of an MCA3 logic cell. Thus, the flip-flops 41a–41d can be implemented into cells. Similarly, equation 2 says that there are two gates in the FIG. 3 circuit, and each gate can be implemented in one-quarter of an MCA3 logic cell. Thus, the FIG. 3 logic gates 42 and 43 can be implemented in one-half of a cell.

Equation 4 analyzes the chip space that is required to implement the FIG. 4 circuit. In FIG. 4, there are a total of $2(N+1)+2$ gates, and each gate can be implemented in one-quarter of an MCA3 logic cell. Thus, for the case where N is equal to 15, the FIG. 4 circuit can be implemented in eight and one-half logic cells. Note that no additional chip space is required for the conductors 51-0 through 51-N since they are accommodated by interconnect channels that are provided on the chip between the logic cells.

Next, referring to equations 5, 6, and 7, they analyze the chip space that is required to implement the FIG. 5 circuit. Equation 4 says that in the case where counter 64 has a maximum count of 15, it can be implemented with four flip-flops; and they occupy two MCA3 logic cells. Equation 6 says there are five logic gates in the FIG. 5 circuit and they can be implemented in one and one-quarter MCA3 logic cells. And equation 7 says that a one-of-sixteen decoder 65 can be implemented with four one-of-four decoders, each of which occupies one-half of an MCA3 logic cell. Thus, decoder 65 can be implemented in two cells.

Equations 8 and 9 analyze the FIG. 6 circuit. Equation 8 says that the two flip-flops of FIG. 6 can be implemented in one MCA3 logic cell; while equation 9 says that the four gates of FIG. 6 can be implemented in one MCA3 logic cell.

Combining the results of equations 1 thru 9 yields equation 10 which says that the entire test module can be implemented in eighteen and one-quarter MCA3 logic cells. Each MCA3 type of chip has a total of 414 logic cells; and thus the percent chip space which the tester module 10b occupies is only 4.40%.

A preferred embodiment of the invention has now been described in detail. In addition, however, many changes and modifications can be made to the above embodiment without departing from the nature and spirit of the invention. For example, the tester module 10b certainly is not limited to an MCA3 logic cell implementation since many other logic cell chips are commercially available with similar packing densities.

Accordingly, it is to be understood that the invention is not limited to the above embodiment but is defined by the appended claims.

What is claimed is:

1. An integrated circuit chip of the type that contains clocked logic circuitry, wherein said chip further includes a tester module for determining the minimum pulsewidth at which said clocked logic circuitry will operate; said tester module comprising:

a timing means for generating constant width timing pulses;

a counting means, coupled to said timing means, for producing count signals which count modulo N in synchronization with said timing pulses, where N is a predetermined positive integer; and, a pulsewidth shaping means, coupled to receive said timing pulses and said count signals, for repeatedly generating a sequence of multiple variable width clock pulses in response thereto;

each variable width clock pulse of said sequence having a different width that is selected by aid modulo N count signals, and the pulsewidths of said sequence changing monotonically and ranging from being large enough for said clocked logic circuitry to properly operate to being too small for proper operation.

2. An integrated circuit chip according to claim 1 wherein at least some of the clock pulses line each sequence are less than four hundred picoseconds wide.

3. An integrated circuit chip according to claim 2 wherein said pulsewidth shaping means includes:
   a plurality of signal delaying components which receive and pass said constant width timing pulses with respective different amounts of delay; and
   a means for chopping said constant width timing pulses immediately after the delay through a certain one of said delaying components which is selected by said count signals.

4. An integrated circuit chip according to claim 3 wherein said signal delaying components are conductive lines, each of which is shaped to delay said constant width timing pulses by a different amount.

5. An integrated circuit chip according to claim 1 wherein said counting means sequentially increments said modulo N count, and said pulseswidth aping means increases the pulsewidth of said variable width pulses as said count increases.

6. An integrated circuit chip according to claim 5 wherein said tester module further includes a control circuit which receives a digital response signal to said variable width pulses from said clocked logic circuitry, and wherein said control circuit is coupled to said counting means and prevents said count signals from incrementing as soon as said response signal changes state in response to said variable width pulses.

7. An integrated circuit chip according to claim 1 wherein said counting means sequentially decrements said modulo N count, and said pulsewidth shaping means decreases the pulsewidth of said variable width pulses as said count decreases.

8. An integrated circuit chip according to claim 7 wherein said tester module further includes a control circuit which receives a digital response signal to said variable width pulses from said clocked logic circuitry, and wherein said control circuit is coupled to said counting means and prevents said count signals from decrementing as soon as said response signal stops changing state in response to said variable width pulses.

9. An integrated circuit chip of the type that contains clocked logic circuitry, wherein aid chip further includes a tester module for determining the minimum pulsewidth at which said clocked logic circuitry will operate; said tester module occupying less than 5% of the chip surface area and including a pulsewidth shaping means for repeatedly generating a sequence of multiple variable width clock pulses with the pulsewidths of said sequence changing monotonically and ranging from being large enough for said clocked logic circuitry to properly operate to being too small for proper operation.

10. An integrated circuit chip according to claim 9 wherein at least some of the clock pulses in each sequence are less than four hundred picoseconds wide.

11. An integrated circuit chip according to claim 9 wherein said pulsewidth shaping mans includes a plurality of conductive lines and the widths of said variable width clock pulses are set by the delay through said conductive lines.

12. An integrated ,circuit chip according to claim 9 wherein said pulsewidth shaping means includes a modulo N counter which sequentially increments and increases the pulsewidth of said variable width pulses as said count increases.

13. An integrated,,circuit chip according to claim 9 wherein said pulsewidth shaping means a modulo N counter which sequentially decrements and decreases the pulsewidth of said variable width pulses as said count decreases.

14. An integrated circuit chip according to claim 9 wherein said tester module has terminals for receiving control signals that select the sequence in which said pulsewidths vary.

* * * * *